United States Patent [19]

Miyashita et al.

[11] Patent Number: 5,182,121

[45] Date of Patent: Jan. 26, 1993

[54] HOT PRESS

[75] Inventors: Akimi Miyashita, Toride; Mutsumasa Fujii, Tsuchiura; Minoru Kubosawa, Kashiwa; Keiichiro Torii, Nagareyama; Nobuaki Ooki, Hadano; Kiyonori Kogawa, Hiratsuka; Masami Kawaguchi, Hadano; Hideyasu Murooka; Masayuki Kyooi, both of Yokohama, all of Japan

[73] Assignees: Hitachi, Ltd.; Hitachi Techno Engineering Co., Ltd., Tokyo, Japan

[21] Appl. No.: 594,711

[22] Filed: Oct. 9, 1990

[30] Foreign Application Priority Data

Oct. 11, 1989 [JP] Japan ................... 1-263017

[51] Int. Cl.$^5$ ............................................. B29C 43/00
[52] U.S. Cl. ....................... 425/338; 100/90; 100/93 P; 100/194; 156/286; 156/382; 156/583.1; 425/405.1; 425/406; 425/407
[58] Field of Search ........... 100/90, 93 R, 93 P, 100/194; 156/286, 382, 583.1; 425/405.1, 406, 407, 338, 504, 508, 509, 518, 520, DIG. 47, DIG. 60

[56] References Cited

U.S. PATENT DOCUMENTS

| 3,695,806 | 10/1972 | Arfert | 425/508 |
|---|---|---|---|
| 4,204,822 | 5/1980 | Hewitt | 425/DIG. 60 |
| 4,551,085 | 11/1985 | Epel et al. | 425/405.1 |
| 4,666,551 | 5/1987 | Soberay et al. | 156/286 |
| 4,857,135 | 8/1989 | Copp | 425/338 |
| 4,908,087 | 3/1990 | Murooka et al. | 156/286 |

FOREIGN PATENT DOCUMENTS

| 53-7937 | 3/1978 | Japan | 425/405.1 |
|---|---|---|---|
| 63-49411 | 3/1988 | Japan | 425/405.1 |
| 63-130300 | 6/1988 | Japan | 425/405.1 |
| 63-283911 | 11/1988 | Japan | 425/405.1 |
| 149050 | 1/1962 | U.S.S.R. | 425/405.1 |
| 508598 | 7/1939 | United Kingdom | 425/405.1 |

Primary Examiner—Jay H. Woo
Assistant Examiner—Scott Bushey
Attorney, Agent, or Firm—Antonelli, Terry, Stout & Kraus

[57] ABSTRACT

A hot press including a displaceable sleeve for surrounding materials of a multi-layer substrate under a reduced pressure condition, a gas pressurizing condition and a heating condition with thermal plates. Upper and lower sealing units seal an interior of the sleeve, with a mechanism lowering and raising the sleeve. A pilot check mechanism prevents a lower bolster from raising/lowering upon the reduced pressure condition and the gas pressure condition, and a retainer maintains the lowered or raised condition of the sleeve. The multi-layer substrate is formed under the reduced pressure condition and the gas pressure condition. Accordingly, the atmosphere and moisture between the materials of the multi-layer substrate and volatile composition are removed. Additionally, a void generated during the heat and pressure process by the heating plates is eliminated from the multi-layer substrate. By carrying out the formation of the multi-layer substrate at the heat and pressure by the heating plates under the gas pressure condition, a final dimensional precision and shape are enhanced and a warpage or twist is suppressed.

2 Claims, 11 Drawing Sheets

HOT PRESS

BACKGROUND OF THE INVENTION

1. Field of the Invention

The present invention relates to a hot press for producing a multi-layer substrate made of printed circuit boards, and, more particularly, to a hot press suitable for forming a high quality multi-layer substrate and reducing a cost thereof.

2. Description of the Prior Art

With the demand for multi-layer substrate having a higher density, there are increased demands for ensuring against voids between the layers, displacement between the layers, as well as a demand warpage or twist of the substrate, and for final dimensional precision. Voids are formed by gas, residing in layers which gas is contained in bubble or moisture in the atmosphere when a material for the multi-layer substrate is exposed in the atmosphere or volatile composition contained in an adhesive resin. In order to prevent the generation of the voids, a material for a multi-layer substrate including a resin, called prepreg for adhesion, is heated and pressurized to expell the voids from its marginal portion together with the resin flow. For this purpose, Japanese Patent Unexamined Publication No. 62-23722 shows a technique in which a central portion of the heating plate is made of material having a high thermal expansion coefficient and the heating plate is heated to thereby increase the pressure of the central portion thereof On the other hand, Japanese Patent Unexamined Publication No. 62-56140 discloses a technique in which, in order to remove voids and to enhance a dimensional precision in thickness of products after the press process, a multi-layer substrate is moulded under a reduced pressure for 150 to 500 seconds by controlling the resin amount and the resin flow of the resin-impregnated substrate. Furthermore, Japanese Patent Unexamined Publication No. 62-68748 shows another technique in which a surrounding wall for preventing the adhesive resin molten by heat from overflowing is provided for the substrate under the pressurized condition, thereby crushing and removing the bubble contained in the substrate.

Japanese Patent Unexamined Publication No. 61-295038 shows a technique in which the heating operation and the pressurizing operation are controlled on a theory such a theory that the warpage or twist is due to non-uniformity in resin flow dependence upon a thermal hysteresis and a pressure timing hysteresis of the adhesive resin.

The displacement between the layers not only cause adverse affects in final configuration or parallelism but also damage or breakage of circuit wires or conductors. Japanese Patent Unexamined Publication No. 59-188999 shows a method for overcoming this problem, wherein an auxiliary ram is used to maintain the parallelism in a satisfactory condition against the non-uniformity in dimension of thickness of the material of the multi-layer substrate. In the same manner, Japanese Patent Examined Publication No. 61-54580 proposes a method in which a metallic plate with a displacement preventing portion located along its marginal portion is used.

In order to simultaneously overcome the problems of the void, the displacement, and the dimensional precision in final configuration, Japanese Patent Unexamined Publication No. 57-118698 shows a method in which a space between the thermal plates are maintained under the reduced pressure with application of heat and pressure, and Japanese Patent Unexamined Publication No. 62-156931 shows a method in which the internal portion of the substrate is covered by a film or a sheet to be maintained under a reduced pressure condition, and then the substrate is heated by heating plates. Moreover, Japanese Patent Unexamined Publications Nos. 61-43543 and 61-43565 show a method in which, a high pressure vessel called autoclave is used wherein the material of the multi-layer substrate is covered by a film or sheets, with an interior of the film or sheet being maintained under a reduced pressure condition and, thereafter, the material is heated under pressure with nitrogen gas or $CO_2$ gas within the high pressure vessel. Also, instead of coverage by the film or sheet, Japanese Patent Unexamined Publications Nos. 61-290036 and 61-293836 show a method in which a box-shaped vessel called pressure chamber, whose top surface is movable up and down, is used. Furthermore, Japanese Utility Model Unexamined Publication 61-185598 shows a method in which an entire press for applying heat and pressure is provided in a vacuum heater.

With high density multi-layer substrate, a width of wires or circuit conductors and a space between the circuit conductors are narrow, a space of lands is small, and through-holes are formed after the formation of the multi-layers. Accordingly, there is a demand for the substrate in which void does not occur during he heat and pressure process; a displacement of the layers is small; there is small warpage or twist; and an expansion or contraction is suppressed for the final dimensional precision as much as possible. At the same time, a breakage of the circuit conductors must be avoided. In order to eliminate or suppress the causes of failure, although the causes may depend upon the material of the adhesive resin interposed between the layers, it is desired to reduce the heating temperature and pressure as much as possible within suitable ranges. In the foregoing prior art, although the pressurizing operation exceeding 50 kg/cm$^2$ is carried out as disclosed in Japanese Patent Unexamined Publications Nos. 61-295038 and 62-23733, it has been found that a void does not occur even under the pressure below 20 kg/cm$^2$ if the suitable temperature condition is selected. Also, it is desired that the atmospheric air and moisture between the layers of the multi-layer substrates is removed once under the reduced pressure condition, and further the preheating process and the prepressurizing process with the thermal plates are carried out under the reduced pressure condition, thereby removing the volatile composition of the adhesive resin; and that thereafter, the environmental space is heated under pressure with a prescribed gas such as, for example, nitrogen gas or $CO_2$, so that an external force is applied to a peripheral or marginal portion of the multi-layer resin to perform the final production with the thermal plates while preventing the displacement of the layers and the overflow of the adhesive resin.

The prior art document, substantially meeting the foregoing demands, is Japanese patent Unexamined Publication 62-156931. However, this conventional technique suffers from the following disadvantages. Namely, it is difficult to finish the final configuration and dimensional precision within predetermined ranges since this publication does not relate to a heat and pressure process with the thermal plates. Also, this system requires a long time for evacuating the high pressure vessel or heating the vessel. Additionally, the film or sheet for covering the material of the multi-layer substrate and the air pressure chamber are expensive. Also, mounting and removal of the vessel is time-consuming, resulting in low working efficiency. Finally, the entire apparatus is expensive.

SUMMARY OF THE INVENTION

An object of the invention is to provide a hot press for producing a high density multi-layer substrate with a high final dimensional precision without voids to thereby enhance the job efficiency and reduce overall production costs.

In order to attain the above or other objects, according to the present invention, there is provided a hot press comprising a sleeve or jacket raised for enabling a supply of the materials of multi-layer substrate into the respective heating plates and for removal of the multi-layer substrate formed by heat and pressure conditions and lowered upon a pressure reduction to surround the materials of the multi-layer substrates. Upper and lower sealing means seal an interior of the sleeve, with raising and lowering means for, with raising and lowering, the sleeve pilot check mechanism prevents a lower bolster from being raised or lowered during a reduced pressure condition and reduction in a gas pressure condition in an interior of the sleeve. A retainer means retains the sleeve in a raised position.

Also, in order to make it possible to keep the reduced pressure condition and the gas pressure condition without using any film or sheet, the raising and lowering of the sleeve attains the reduced pressure condition and the gas pressure condition.

During processing of supplying the materials of the multi-layer substrate into the respective thermal plates, the sleeve is retained at a raised position by the retainer means thereby ensuring safety in the working space. After the completion of supplying the materials, the sleeve is released from the retainer means and is lowered by the raising and lowering means. At the lower position of the sleeve, the sealed space is formed in the interior of the sleeve by the upper and lower sealing means to maintain a reduced pressure condition of 5 to 50 Torr by a discharging means. The atmosphere and moisture contained in fine spaces between the materials of the multi-layer substrate are removed under the reduced pressure condition. When the sealed space in the interior of the sleeve is under the reduced pressure condition, there is a pressure difference between the upper and lower surfaces of the lower bolster, and the lower bolster is apt to rise. However, because of the provision of the pilot check mechanism in the oil pressure lines connected to the rod-side port of the hydraulic cylinder, the lower bolster is prevented from moving upwardly to thereby preventing an unexpected accident.

Subsequently, the reduced pressure condition is maintained, and the preheating and prepressurizing process is carried out by the heating plates, thereby removing the volatile composition contained in the adhesive resin. The temperature of the preheating process is 130° C., the prepressurizing area pressure is 1 to 5 kg/cm$^2$, with the time being ten to twenty minutes. It is desirable to adjust the preheating temperature, the area pressure and the time appropriately.

Subsequently, the heat and pressure process and the gas pressurizing process are performed simultaneously. In this case, the heating temperature of the heating plate is 170° C. when the adhesive resin is an epoxy resin base material, whereas, the heating temperature is 200 to 280° C. in the case when the adhesive resin is a polyimide base material. The pressurizing area pressure is 1 to 5 kg/cm$^2$ and is maintained for one hundred to two hundred minutes. On the other hand, the gas pressure is commenced about ten minutes later or simultaneously with the heat and pressure process with the heating plates. The gas pressure is applied at 5 to 20 kg/cm$^2$ for thirty to fifty minutes.

The materials of the multi-layer substrate are heated uniformed due to the preheating and prepressurizing process with the heating plates. Since the external pressure is applied to the materials, the generation of the unnecessary resin flow, i.e., formation of burrs is avoided.

Since the upper and lower sealing means is subjected to radiation heat or convection heat from the heating plates, a cooling passage for cooling medium such as, for example, water is formed at a mount portion of the sealing means.

BRIEF DESCRIPTION OF THE DRAWINGS

In the accompanying drawings:

FIGS. 7A and 7B are diagrams showing the additional conditions of the temperature, area pressure, atmospheric pressure and the like;

DESCRIPTION OF THE PREFERRED EMBODIMENTS

Figure 1:
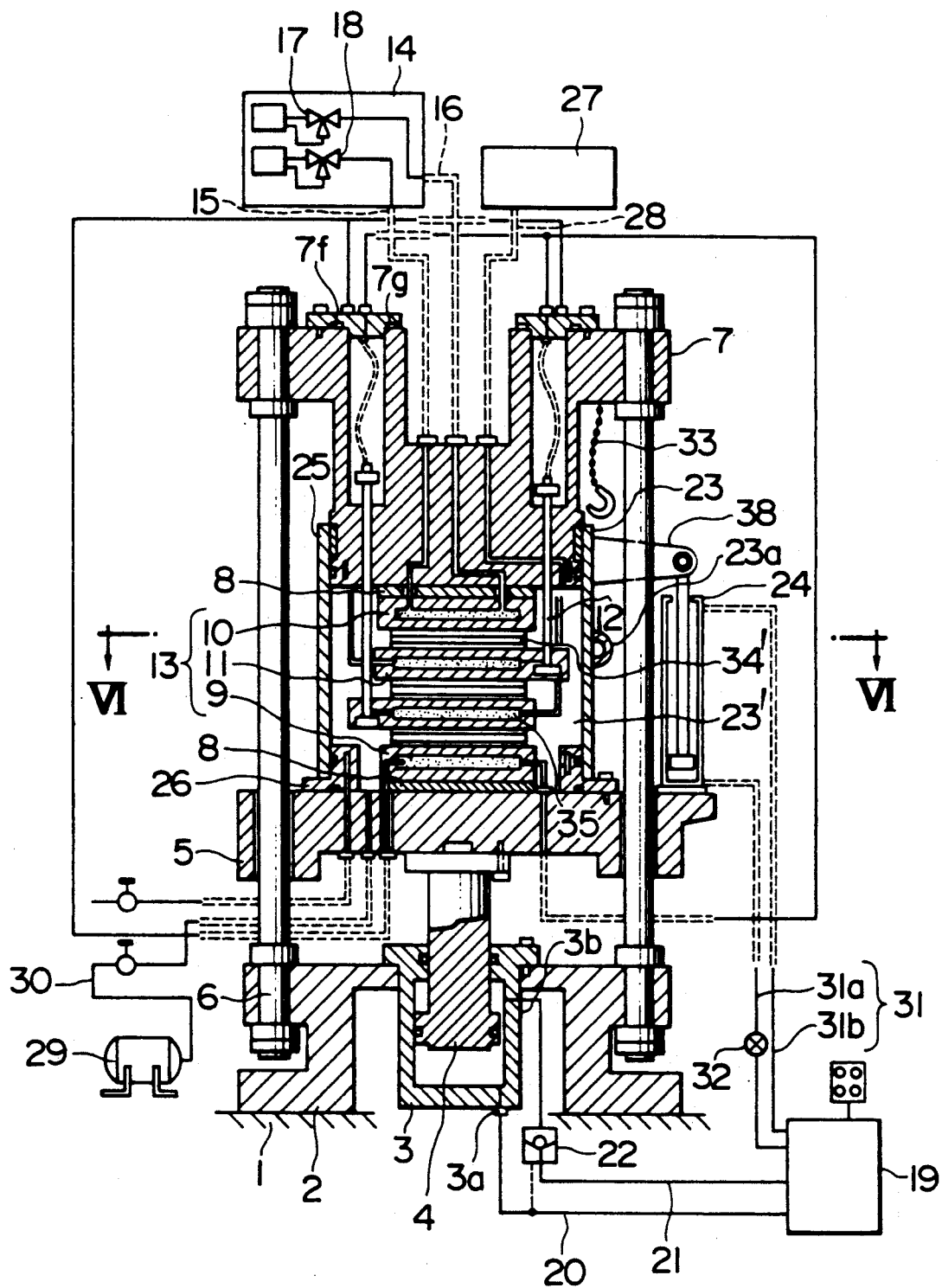
FIG. 1 is a cross-sectional view showing a hot press according to the present invention under the sealed condition attained by the sleeve.
Figure 6A:
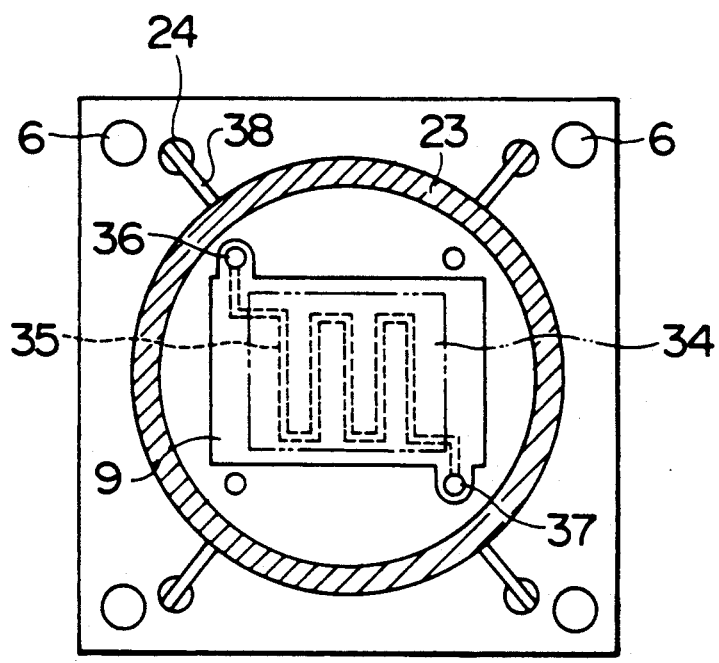
FIGS. 6A and 6B are plan views of the sleeve and the thermal plate as viewed in the direction VI—VI of FIG. 1.
Figure 6B:
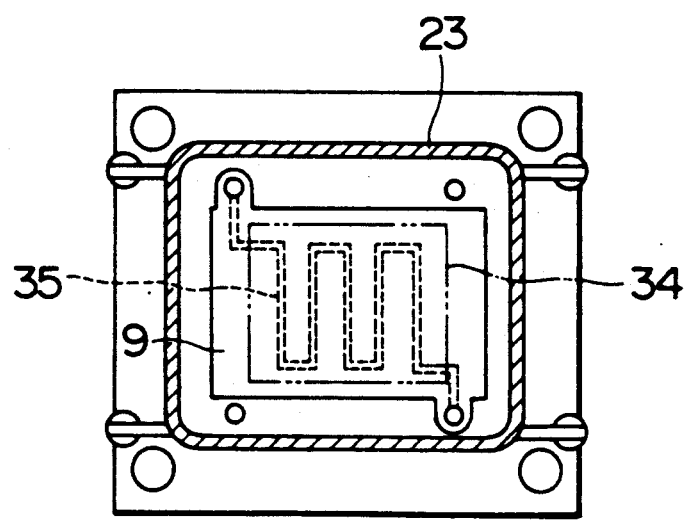

FIG. 1 shows a hot press for producing a multi-layer substrate according to the invention, wherein hydraulic cylinder 3 is arranged in a central portion of a base frame 2 disposed on a floor 1. A lower bolster 5, mounted on a reciprocable ram 4, is guided by a column 6 composed of a plurality of posts fixed to the base frame 2. At an upper position confronting the lower bolster 5, there is provided an upper bolster 7 fixed to the column 6. A lower heating or thermal plate 9 is mounted on an upper surface of the lower bolster 5 through an insulating plate 8. In the same manner, an upper heating, thermal plate 10 is mounted on the upper bolster 7 through another insulating plate 8. A single or a plurality of intermediate heating plates 11 are supported by suspension rods 12 between the lower heating plate 9 and the upper heating plate 10. The respective heating plates 13 such as the lower heating plate 9, upper heating plate 10 and intermediate plates 11 have internal thermal medium passages 35 for steam or like, as shown in FIGS. 6A and 6B. The thermal medium is supplied to one of the respective heating plates 13 through a heating hose 15 from a heat source 14 forming the heat means, and is returned to a heat source 14 through a cooling hose 16 past the heating hose 15. The cooling operation of the respective heating plates 13 after the completion of a pressing operation is performed by switching switch valves 17 and 18 to direct the cooling medium to pass from a cooling source, provided on the heat source 14, through the cooling hose 16, the thermal medium passages 35 and the heating hose 15 back to the cooling source. For this reason, the above-described heating source 14 will be referred to as a "heating/cooling source".

A pressure oil is supplied from a hydraulic pressure source 19 through hydraulic lines 20 and 21 into the hydraulic cylinder 3. The hydraulic line 20 is connected to a head-side port 3a of the hydraulic cylinder 3. The hydraulic line 21 is connected to a rod-side port 3b of the hydraulic cylinder 3 through a pilot check mechanism 22.

On a side of the upper bolster 7, there are formed an upper sealing means 25 on the upper bolster 7 and a lower sealing means 26 on the lower bolster 5, with a jacket or sleeve 23 being vertically movable by a moving means 24 so as to form a sealed internal space 23' in a position where the sleeve 23 is lowered. The sealed space 23' is maintained under a reduced pressure condition by discharging an internal atmospheric air through a discharge passage 28 by a discharging means 27. The sealed space 23' is maintained under a gas pressurized condition through a gas piping 30 by a gas supply means 29. The lowering/raising operation of the moving means 24 for the sleeve 23 is performed by supplying pressurized oil from the hydraulic pressure source 19 through a vertical line 31. A vertical line element 31a is used for elevating the sleeve 23 with a centrally disposed flow rate control valve 32 being disposed in the line 31, and a vertical line 31b is used for lowering the sleeve 23. One or more retainer brackets 23a are provided on the sleeve 23 and are capable of engaging with a single or a plurality of retainer means 33 provided on the upper bolster 5.

Figure 2:
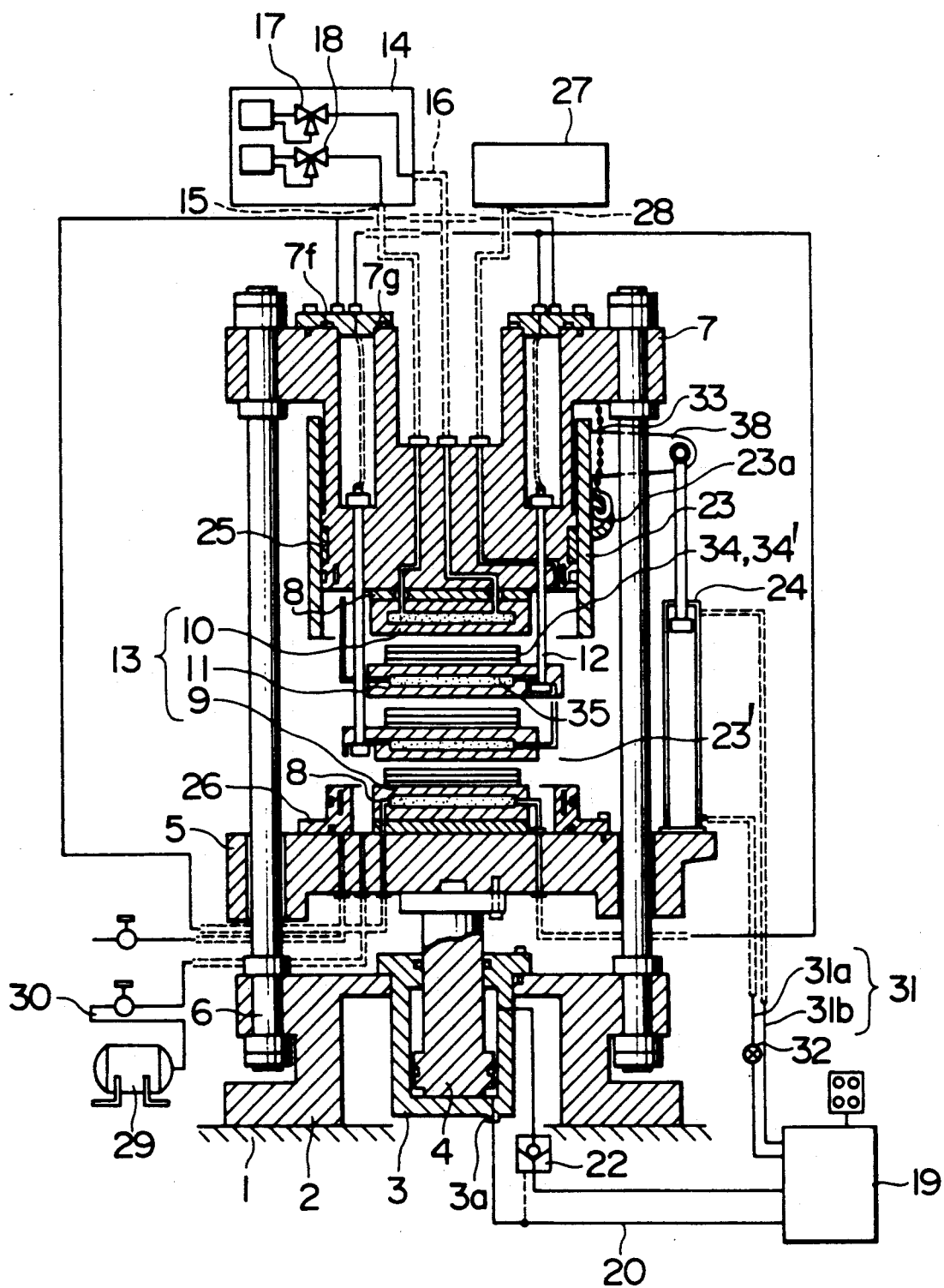
FIG. 2 is another cross-sectional view showing the hot press shown in FIG. 1, under the press release condition where the sleeve is raised.

FIG. 2 illustrates a state where the sleeve 23 is retained in the elevated or raised position by the retainer means 33. In this state, materials 34' for the multi-layer substrate 34 are interposed between the respective thermal plates 13.

Figure 3:
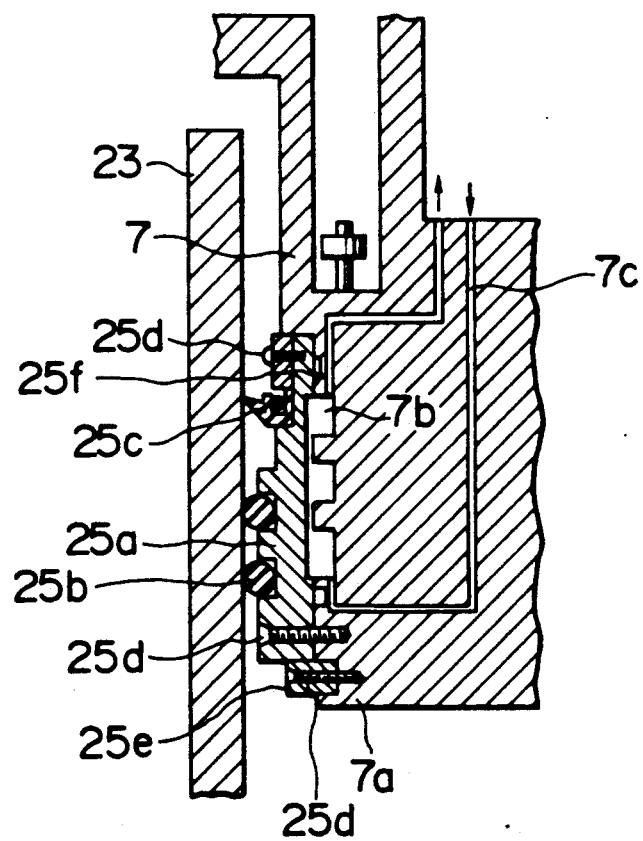
FIG. 3 is a partially enlarged sectional view showing an upper sealing means and a sleeve shown in FIG. 1.

FIG. 3 is an enlarged view showing the upper sealing means 25. A seal support member 25a has O-rings 25b and a seal ring 25c and is slidable when the sleeve 23 is raised or lowered. The seal support member 25a is fixed to a predetermined position of the upper bolster 7 by fastening bolts 25d and an shear-lug 25e for preventing the displacement of the sealing means 25. The shear-lug 25e is in the form of a divided ring and is fixedly inserted into a groove 7a of the upper bolster 7 with the fastening bolt 25d. Also, on the upper bolster 7, there are provided passages 7b and 7c for the cooling medium for cooling the upper sealing means 25, so that the cooling medium is caused to flow in a direction indicated by arrows to cool the seal support member 25a. A seal member 25f is interposed between the seal support member 25a and the upper bolster 7 for preventing a leakage of the cooling medium.

Figure 4A:
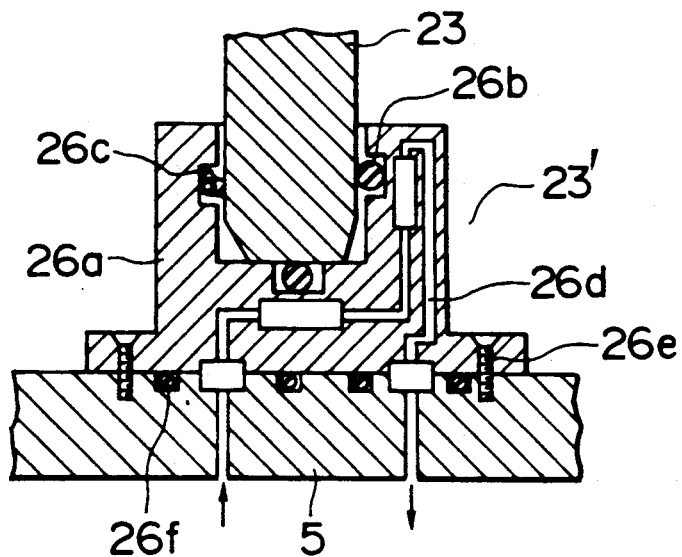
FIGS. 4A and 4B are partially enlarged sectional views showing a lower sealing means shown in FIG. 1.
Figure 4B:
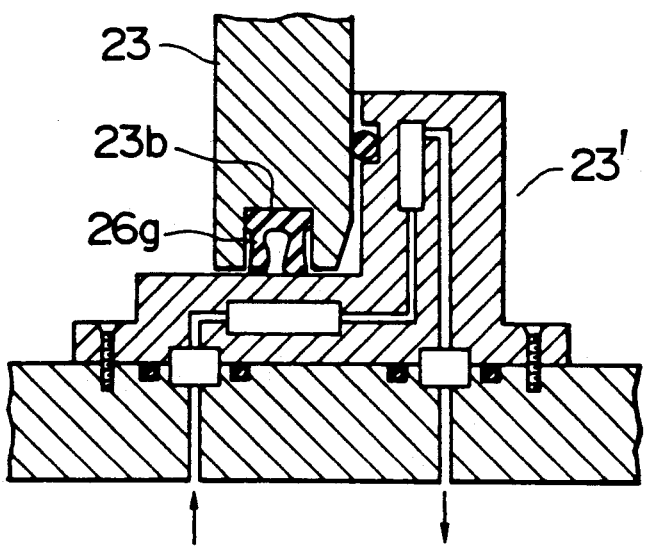

FIG. 4A and 4B are enlarged views showing the lower sealing means 26. FIG. 4A shows a state in which the lower portion of the sleeve 23 is sealed by a seat 26a, an O-ring 26b and a lip seal 26c. In seat 26a, a cooling medium passage 26d is formed to cause the cooling medium to flow in a direction indicated by arrows to cool the seat 26a. The seat 26a is mounted on the lower bolster 5 by fastening bolts 26e, and O-rings 26f are provided between the seat 26a and the lower bolster 5 to seal the sealed space 23' and the cooling medium. FIG. 4B is an enlarged view showing another embodiment of the lower sealing means 26 in which a concave groove 23b is provided at the lower portion of the sleeve 23 and a lip seal 26g is provided.

Figure 5:
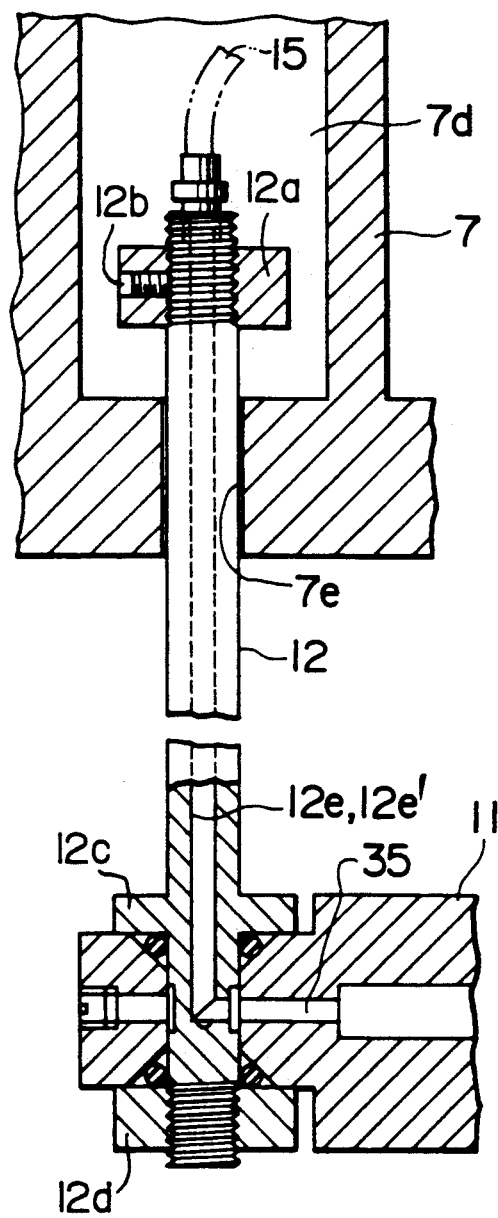
FIG. 5 shows a section of a detailed structure of the suspension rod portion shown in FIG. 1.

FIG. 5 is an enlarged view showing the suspension rod 12. At an upper end portion, a nut 12a is provided and is fastened by a fastening screw 12b. At the lower end portion of the suspension rod 12, the intermediate heating plate 11 is fixedly clamped by a flange 12c and a nut 12d. In the suspension rod 12, a passage 12o is formed for allowing the heating medium for heating the intermediate plate 11 or the cooling medium for cooling it to pass therethrough. The passage 12e is connected to the heating hose 15 or the cooling hose 16 at the upper end face of the suspension rod 12. In the embodiment shown in FIG. 5, two suspension rods are provided, one being connected to the heating hose 15 and the other being connected to the cooling hose 16. However, if only one suspension rod is used, two passages 12e and 12e' are formed in an interior of the suspension rod 12 to enable a recirculation of the thermal medium through the passage 35 in the intermediate heating plate 11. The suspension rod 12 is mounted so as to be vertically movable by a hollow portion 7d and a guide portion 7e. A sealing lid or cover 7f (FIG. 1) is provided at an upper portion of the hollow portion 7d, and a packing 7g is provided on sealing plate 7d.

FIG. 6A shows the case where the sleeve 23 is a cylinder, and FIG. 6B shows the case where the sleeve 23 is rectangular. Two-dot and dash lines shows an outline of the multi-layer substrate 34. In the lower heating plate 9, a thermal medium passage 35 is formed for allowing the heating or cooling medium for heating or cooling the heating plate to flow through the passage 35. The heating hose 15 and the cooling hose 16 are connected to the heating port 36 and the cooling port 37, respectively. One or more arms 38 are formed in the sleeve 23 and are mounted on the moving means 24.

Figure 7A:
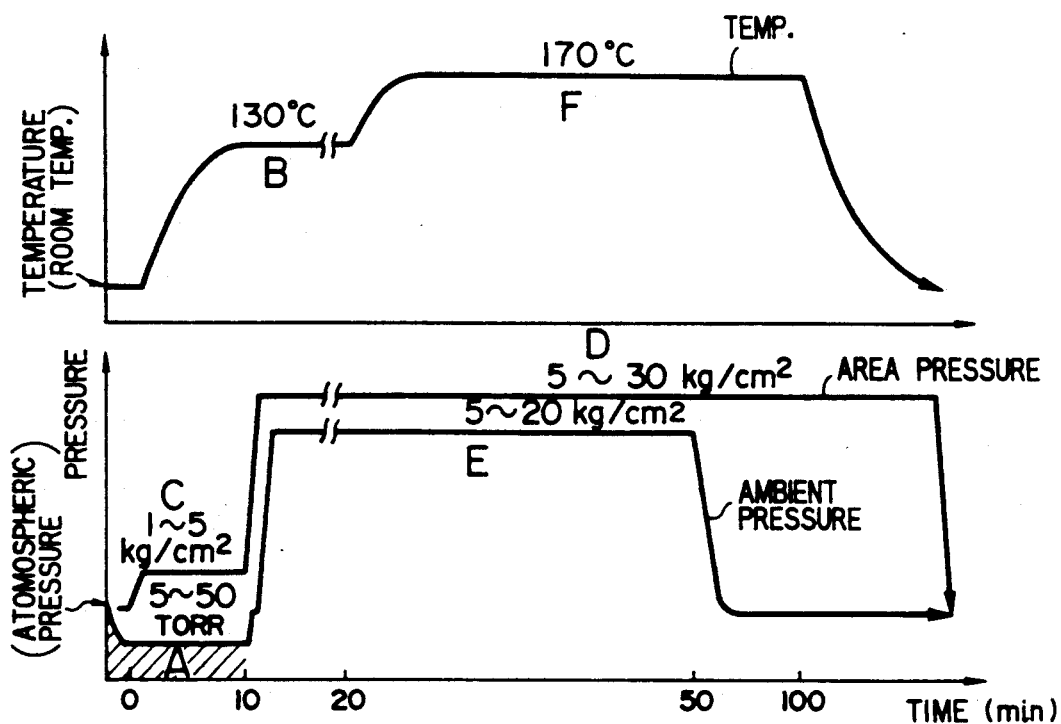

Subsequently, the operation of the hot press according to the present invention will now be explained. As shown in FIG. 2, the sleeve 23 is retained at the raised position by the retainer means 33. The materials 34' for the multi-layer substrate 34 are interposed among the upper heating plate 10, the intermediate heating plates 11 and the lower heating plate 9. Then, the retainer means 33 is released, and the sleeve 23 is lowered by the moving means 24 as shown in FIG. 1. The sealed internal space 23' is formed within the sleeve 23 by the upper and lower sealing means 25 and 26. Subsequently, atmospheric air in the sealed space 23' is discharged by the discharge means 27. As shown in FIG. 7A, a reduced pressure condition A at 5 to 50 Torr is maintained for about ten minutes. Two or three minutes after the start of the reduced pressure condition A, a preheating B process at about 130° C. and a prepressurizing process C at 1 to 5 kg/cm² in terms of area pressure are started. Under the reduced pressure condition A, the atmospheric air and moisture between the materials 34' of the multi-layer substrate 34 are removed, and by the preheating process B and the prepressurizing process C, the volatile composition contained in the adhesive resin for the materials 34' is removed. Since the materials 34' are uniformly heated by the preheating B and the prepressurizing process C, the softening condition of the resin is also kept uniform. Thus, the materials 34' are uniformly press-bonded also upon the application of the pressure by the respective heating plates 13, and thereby warpage or twist does not occur in the formed multi-layer substrate 34.

After the completion of the reduced pressure condition A, the pressurizing process D is performed by the respective heating plates 13 at 5 to 30 kg/cm² in terms of area pressure. Substantially at the same time with the start of the pressurizing process D, a predetermined gas is supplied into the sealed space 23' from the gas supply means 29 to thereby perform the gas pressuring process E. Nitrogen gas or $CO_2$ gas is used as the pressurizing gas at a pressure of 5 to 20 kg/cm². The gas pressurizing process E will give an external force to the side surface of the materials 34' of the multi-layer substrate. Not only it is possible to suppress of an generation of the unnecessary part, i.e. burrs or the like, and an unnecessary fluidization of the adhesive resin, but also together with the effect of the pressurizing process D, the void is crushed. In addition, the dimensional precision of the product after the hot press may be enhanced.

Furthermore, subsequently to the pressurizing process D, the respective heating plates 13 are heated up to about 170° C. to thereby perform a heating process F. The heating process F is performed at 200 to 280° C. in the case of the materials 34' of the multi-layer substrate 34 is polyimide resin.

Subsequently, after the gas pressurizing process E for 40 to 60 minutes, the heating process F and the pressurizing process D are effected. The heating process F is continued about 30 minutes before the completion of the pressurizing process D. Thereafter, the cooling medium is supplied to the respective heating plates 13 from the heating/cooling source 14 to thereby also cool the multi-layer substrate 34 to the pressurizing process D for each heating plate 13. A heating period of time from the start of the reduced pressure condition A to the completion of the pressurizing process D is changed in dependence upon the material, the number of layers and the volume of the multi-layer substrate 34 one hundred twenty to two hundred minutes.

Figure 7B:
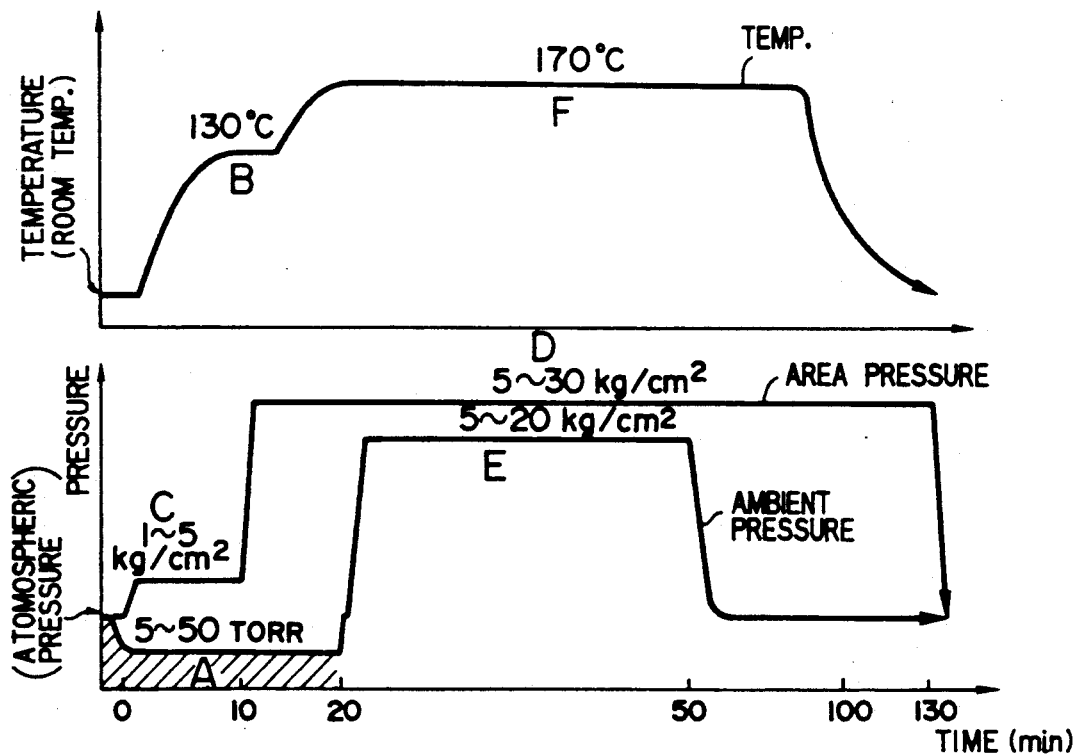

Although in the foregoing operation, the gas pressurizing process E is commenced substantially at the same time as the pressurizing process D, FIG. 7B provides an example wherein the gas pressurizing process E is commenced about 10 minutes later from the start of the pressurizing process D for the purpose of removing volatile components contained in the material 34'.

Figure 8:
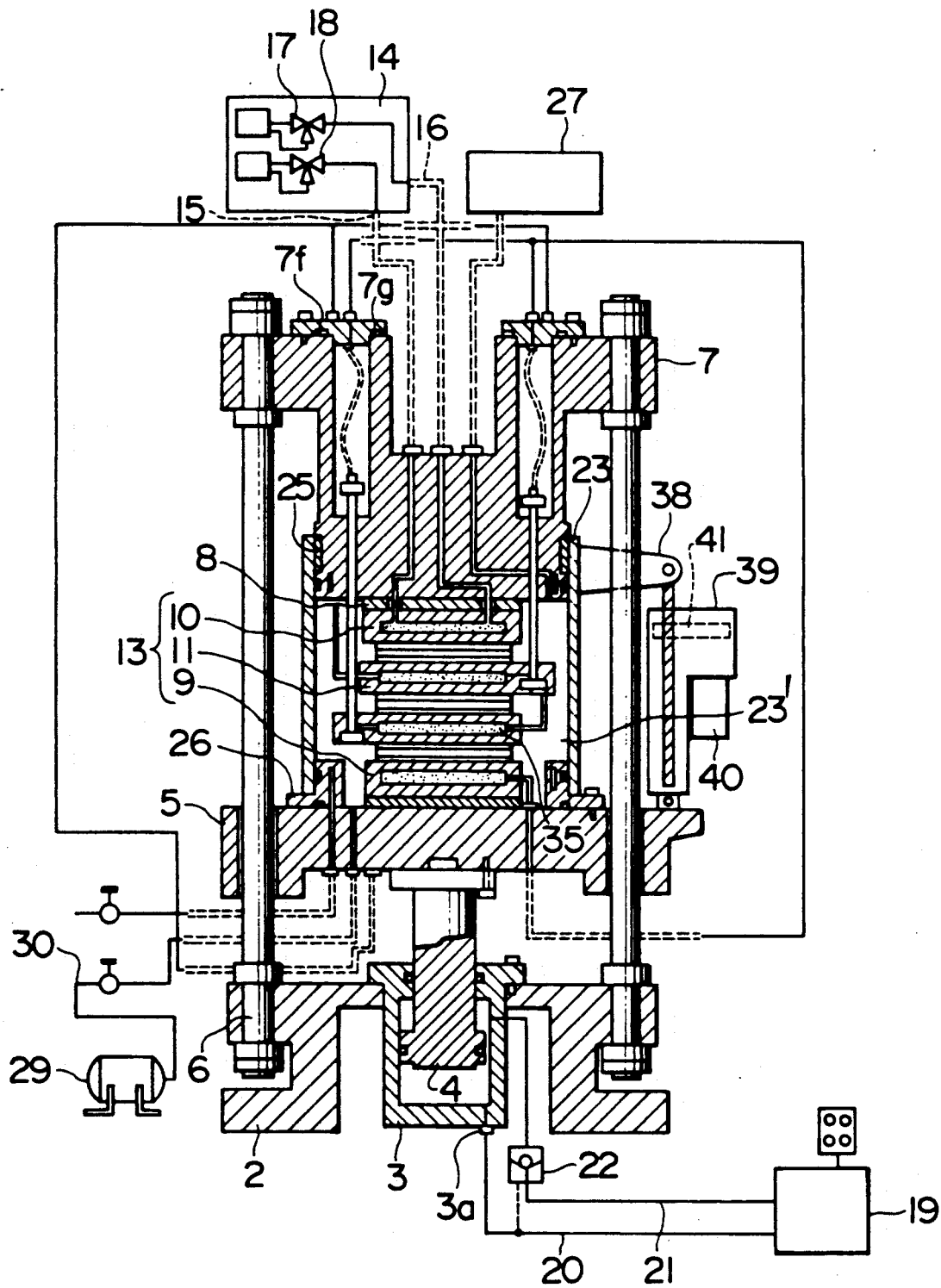
FIG. 8 is a cross-sectional view showing another embodiment of the descending/ascending means of the sleeve.

A second embodiment shown in FIG. 8 where a lowering and raising means 39 for the sleeve 23 comprises an extendable structure including a screw 41 rotated by a motor 40.

Figure 9:
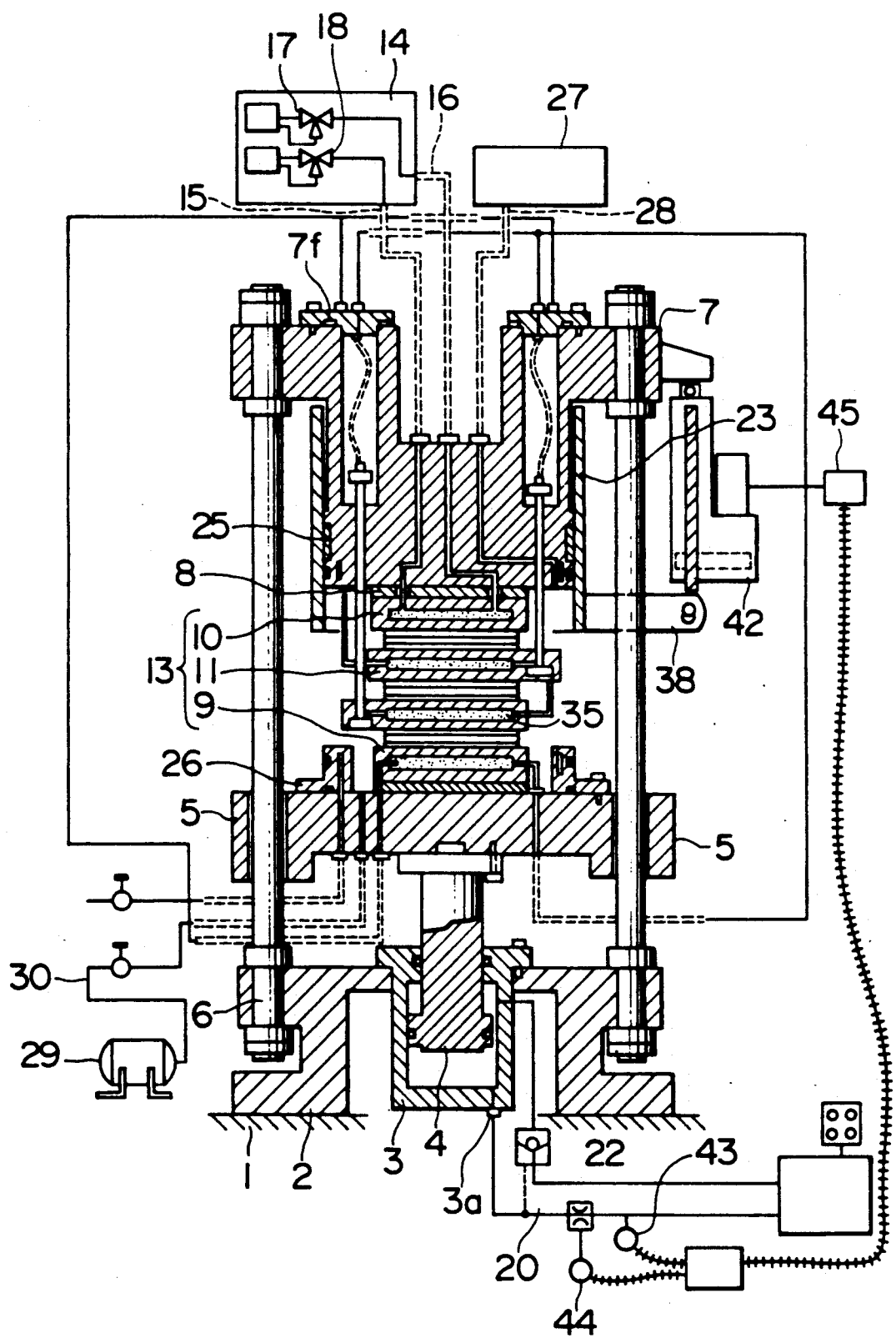
FIG. 9 is a cross-sectional view showing still another embodiment of the descending/ascending means of the sleeve in which the mounting position thereof is changed.

FIG. 9 shows a third embodiment in which the lowering and raising means 42 for the sleeve 23 is located at the upper bolster 7. In the case where the prepressurizing process C and the pressurizing process shown in FIGS. 7A and 7B are effected under the condition of formation of the sealed space 23' with the sleeve 23, the lower bolster 5 is raised by the ram 4 of the hydraulic cylinder 3. Accordingly, a pressure detecting means 43 and a flow rate detecting means 44 are provided in a hydraulic piping 20 for feeding the detected values back to an operation box 45 of the lowering and raising means 42 to contract the means 42 in response to the upward movement of the ram 4 to thereby prevent an unexpected internal stress (load) from occurring in the lower sealing means 26, the means 42 and the sleeve 23.

Figure 10:
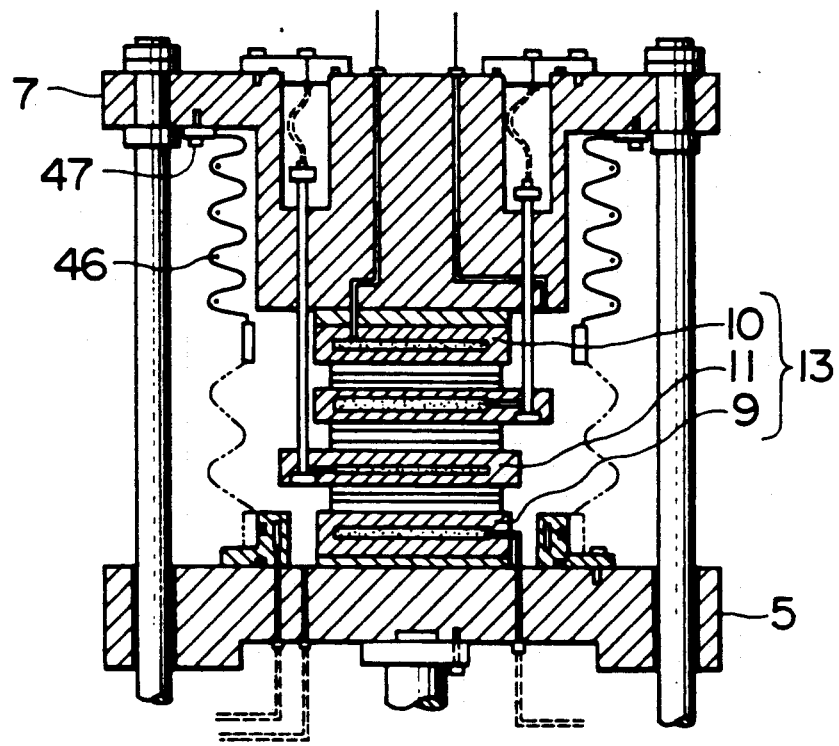
FIG. 10 and FIGS. 11A and 11B are sections of other embodiments in which different sleeve shapes are taken.

A fourth embodiment is shown in FIG. 10, in which a sleeve 46 fashioned as a bellows, is fixed through an upper sealing means 47 to the upper bolster 7. In FIG. 10, the upper sealing means 47 is not slidable with the sleeve 46. It is also possible to reduce the height of the hot press body in comparison with that of the first embodiment.

Figure 11A:
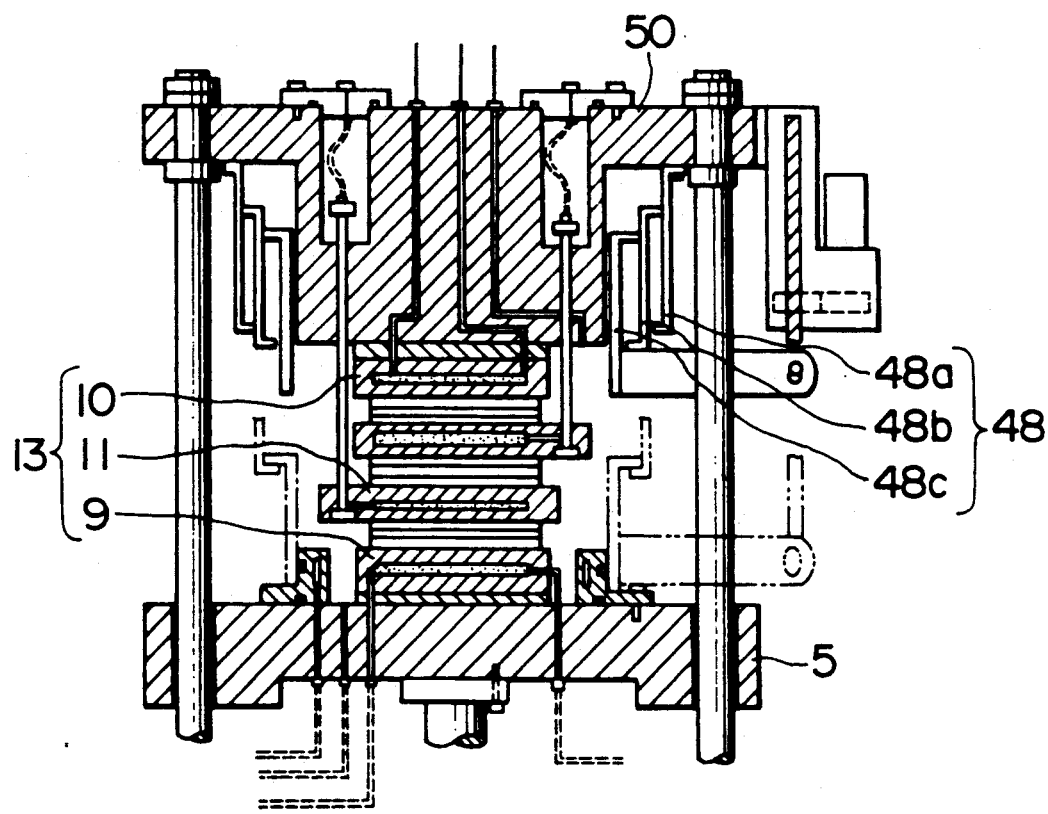
Figure 11B:
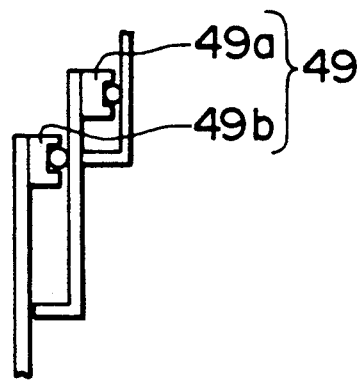

A fifth embodiment is shown in FIGS. 11A and 11b, wherein a sleeve 48 is of the telescopic type composed of a plurality of annular short sleeve members 48a, 48b and 48c. Slidable sealing means 49a and 49b composed of O-rings or lip seals are interposed between the short sleeve members 48a, 48b and 48c. The upper end portion of the sleeve 48 is fixed to the upper bolster 7 through the upper sealing means 50.

What is claimed is:

1. A hot press for mutually aligning materials of a multi-layer substrate of printed circuit boards and adhesive resin and interposing the materials into the heating plates and effecting heating and pressurization to form the multi-layer substrate, the hot press comprising:
   a base frame;
   a lower bolster movable up and down by a ram of a hydraulic cylinder supported by said base frame;
   a column fixed to said base frame for guiding the up and down movement of the lower bolster;
   an upper bolster fixed to an upper end portion of said column and confronting said lower bolster;
   upper and lower heating plates respectively fixed through insulative plates to said upper and lower bolsters;
   an intermediate heating plate located between said upper and lower heating plates and supported by said upper bolster;
   heating means for supplying a thermal medium to said intermediate heating plate, said upper heating plate and said lower heating plate and collecting the thermal medium from the heating plate;
   hydraulic pressure means for supplying pressurized oil to said hydraulic cylinder;
   a sleeve movable up and down along a side surface of said upper bolster by moving means, said sleeve being adapted to surround said materials for the multi-layer substrate with a lower end portion of said sleeve being in contact with an upper surface of said lower bolster;
   first sealing means for sealing an interior of said sleeve when said sleeve is in contact with the upper surface of said lower bolster;
   second sealing means for sealing an interior of said sleeve;
   discharging means for discharging atmosphere contained in said sleeve maintained under a sealed condition by said first and second sealing means;
   means for supplying a gas maintained at a predetermined pressure into said sleeve; and
   a hydraulic means including a pilot check mechanism for preventing said lower bolster from being raised due to a differential pressure between the upper surface and lower surface of said lower bolster when the interior of said sleeve is maintained at one of a vacuum pressure condition and a high pressure condition due to the predetermined gas pressure.

2. A hot press for mutually aligning materials of a multi-layer substrate of printed circuit boards and adhesive resin and interposing the materials into heating plates and effecting heating and pressurization to form the multi-layer substrate, the hot press comprising:
a base frame;
a lower bolster movable up and down by a ram of a hydraulic cylinder supported by said base frame;
a column fixed to said base frame for guiding the up and down movement of the lower bolster;
an upper bolster fixed to an upper end of said column and confronting said lower bolster;
upper and lower heating plates respectively fixed through insulative plates to said upper and lower bolsters;
an intermediate heating plate supported by said upper bolster by suspension rods;
heating means for supplying a thermal medium to said intermediate heating plate, said upper heating plate and said lower heating plate and collecting the thermal medium from the heating plate;
a passage for the thermal medium for at least one of cooling and heating said intermediate plate formed in said suspension rods;
hydraulic pressure means for supplying pressurized oil to said hydraulic cylinder;
a sleeve movable up and down along a side surface of said upper bolster by moving means, said sleeve being adapted to surround said materials for the multi-layer substrate with a lower end portion of said sleeve being in contact with an upper surface of said lower bolster;
first sealing means for sealing an interior of said sleeve when said sleeve is in contact with the upper surface of said lower bolster;
second sealing means for sealing an interior of said sleeve;
discharging means for discharging atmosphere contained in said sleeve maintained under a sealed condition by said first and second sealing means and;
means for supplying a gas maintained at a predetermined pressure into said sleeve.

* * * * *